(12) United States Patent
Tanimura

(10) Patent No.: US 6,479,363 B1
(45) Date of Patent: Nov. 12, 2002

(54) SEMICONDUCTOR INTEGRATED CIRCUIT AND METHOD FOR TESTING THE SAME

(75) Inventor: Masaaki Tanimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/666,479

(22) Filed: Sep. 20, 2000

(30) Foreign Application Priority Data

Apr. 11, 2000 (JP) ........................................ 2000-109917

(51) Int. Cl.$^7$ .............................................. H01L 21/20
(52) U.S. Cl. .................. 438/384; 365/189; 365/189.01; 365/189.05
(58) Field of Search ...................... 438/384; 365/189.05, 365/189.07, 189.01, 189.02, 189, 201

(56) References Cited

U.S. PATENT DOCUMENTS 5,301,155 A * 4/1994 Wada et al. ................. 365/201
6,046,943 A * 4/2000 Walker ................... 365/189.05

FOREIGN PATENT DOCUMENTS

| JP | 9-63296 | 3/1997 |
|---|---|---|
| JP | 9-198895 | 7/1997 |

* cited by examiner

Primary Examiner—David Nelms
Assistant Examiner—Reneé R. Berry
(74) Attorney, Agent, or Firm—McDermott, Will & Emery

(57) ABSTRACT

A coincidence detection circuit 42 is furnished to check whether a plurality of output signals read from a plurality of memory cell arrays CELL0 through CELL3 coincide with one another. A representative output buffer 36 is provided to have the output signal from the cell array CELL0 reach a representative pin DQ0 if the output signals are judged to coincide with one another, and to block the output signal from the cell array CELL0 while putting the representative pin DQ0 in a high-impedance state if the output signals are not judged to coincide. Input/output pins DQ1 through DQ3 are furnished with ordinary output buffers 32.

6 Claims, 6 Drawing Sheets

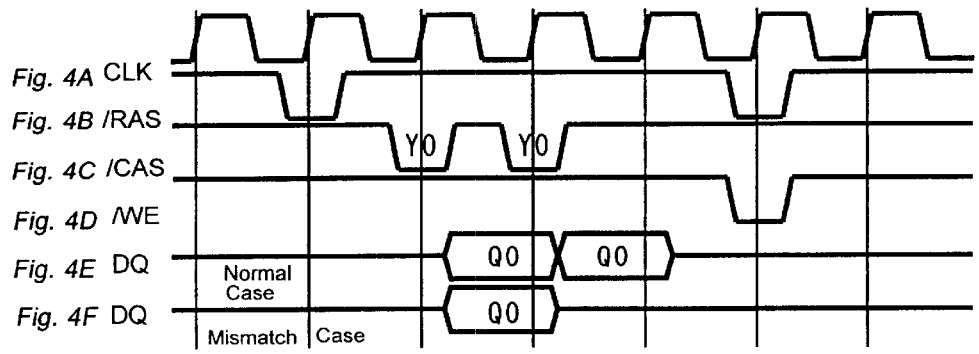
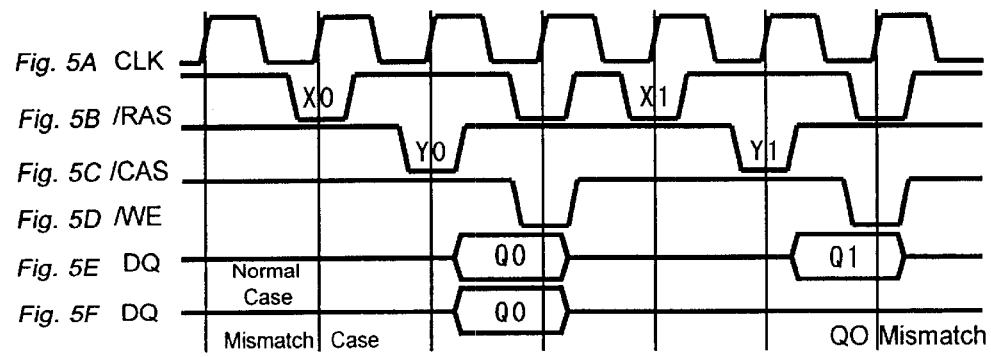

SEMICONDUCTOR INTEGRATED CIRCUIT AND METHOD FOR TESTING THE SAME

BACKGROUND OF THE INVENTION

1. Field of the Invention

The present invention relates to a semiconductor integrated circuit and a method for testing the circuit. More particularly, the invention relates to a semiconductor integrated circuit structured so as to undergo tests in a shorter time with higher precision than before, as well as to a method for testing such a semiconductor integrated circuit.

2. Description of the Background Art

In recent years, ever-increasing functionality of system applications has entailed a growing capacity of built-in memories in semiconductor integrated circuits. In turn, the greater memory capacity in each semiconductor integrated circuit tends to increase the number of I/O pins for writing and reading data to and from the circuit in a concurrent and parallel manner. In order to counter such trends and to speed up tests on semiconductor integrated circuits, techniques have been proposed which utilize a single representative pin to test concurrently a plurality of memory cell arrays.

FIGS. 9A and 9B illustrate how a conventional semiconductor integrated circuit is typically tested. More specifically, FIG. 9A is a block diagram showing a procedure for inputting data through a representative pin DQ0 and writing the input data to a plurality of memory cell arrays CELL0 through CELL3 of a conventional semiconductor integrated circuit. FIG. 9B is a block diagram depicting a procedure for outputting via the representative pin DQ0 signals indicative of states of the multiple memory cell arrays CELL0 through CELL3 in the conventional semiconductor integrated circuit.

As shown in FIG. 9A, the conventional semiconductor integrated circuit typically has I/O pins DQ0 through DQ3 corresponding to the memory cell arrays CELL0 through CELL3. The I/O pins DQ1, DQ2 and DQ3 are furnished with I/O buffers 10 respectively. The I/O buffers 10 are fed with a control signal TCTRL through an inverter 12. The signal TCTRL is held on the Low level in normal mode and raised to the High level in test mode. The I/O buffers 10 are kept active when the signal TCTRL is Low (i.e., in normal mode) and deactivated when the signal TCTRL is brought High (in test mode). That is, no signal is allowed to be input or output through the pins DQ1, DQ2 and DQ3 in test mode. The representative pin DQ0 is provided with an I/O buffer 11 designed to remain active at all times. This means that signals are allowed to be input and output through the pin DQ0 both in normal mode and in test mode.

A selector 14 is interposed between the memory cell array CELL0 and the pin DQ0. The selector 14 has two paths: a normal path for ensuring direct conduction between the pin DQ0 and the memory cell array CELL0, and a test input path for connecting the pin DQ0 to the memory cell arrays CELL0 through CELL3 by way of a buffer circuit 16. If the signal TCTRL is Low (i.e., in normal mode), the selector 14 conducts the normal path alone; if the signal TCTRL is High (in test mode), the selector 14 blocks the normal path and conducts the test input path. The signal TCTRL is also fed to the buffer circuit 16. The buffer circuit 16 remains inactive when the signal TCTRL is Low (in normal mode) and is activated when the signal TCTRL is brought High (in test mode). This means that in test mode, data input through the pin DQ0 are fed equally to all multiple memory cell arrays CELL0 through CELL3.

As depicted in FIG. 9B, the selector 14 is connected to an output terminal of a coincidence detection circuit 18. The coincidence detection circuit 18 is made up of an exclusive-OR circuit having four input terminals connected to the memory cell arrays CELL0 through CELL3. Only when data from the memory cell arrays CELL0 through CELL3 coincide with one another does the coincidence detection circuit 18 effect a High-level output. In addition to the normal path and test input path discussed above, the selector 14 has a test output path which allows the coincidence detection circuit 18 and the pin DQ0 to conduct when the signal TCTRL is driven High (in test mode). This means that in test mode, the pin DQ0 receives a signal indicating whether data from the memory cell arrays CELL0 through CELL3 coincide with one another.

When the conventional semiconductor integrated circuit outlined above is in use, the signal TCTRL is first brought High to initiate test mode. Then common data are written to all memory cell arrays CELL0 through CELL3 by feeding the data to the pin DQ0 for the write operation. A subsequent read operation using an output signal from the pin DQ0 makes it possible to check whether the same data are output from the memory cell arrays CELL0 through CELL3. As described, the conventional semiconductor integrated circuit permits multiple memory cell arrays CELL0 through CELL3 to be tested efficiently by use of a single representative pin DQ0.

One disadvantage of the conventional semiconductor integrated circuit above is that the pin DQ0 receives a signal reflecting the retrieved data coinciding or not coinciding with one another regardless of the High or Low level of the data written to the memory cell arrays CELL0 through CELL3 in test mode. In other words, if the pin DQ0 is set to become High when retrieved data coincide with one another, then the pin DQ0 always gets the High-level signal upon data coincidence regardless of the level of the data written in the arrays CELL0 through CELL3.

In normal mode, the conventional semiconductor integrated circuit transfers signals over a path ranging either from the memory cell array CELL0 to the selector 14 to the pin DQ0, or from the arrays CELL1 through CELL3 to the pins DQ1 through DQ3. In test mode, the circuit transfers signals over a path ranging from the memory cell arrays CELL0 through CELL3 to the coincidence detection circuit 18 to the selector 14 to the pin DQ0. That is, the conventional semiconductor integrated circuit has different signal transfer paths between normal mode and test mode.

In order to measure precisely the time in which to access individual memory cell arrays, it is preferred that relations between data stored in the memory cell arrays on the one hand and signals output to the I/O pins on the other hand remain the same both in normal mode and in test mode. For exact measurement of access times, it is also desired that the signal transfer path be the same in normal mode and in test mode. The conventional test method described above is deficient in these respects and thus inadequate to obtain accurate access times.

There is an additional problem of access delay. The conventional semiconductor integrated circuit transfers signals from the memory cell array CELL0 to the pin DQ0 through the selector 14 in normal mode, but sends signals from the memory cell arrays CELL1 through CELL3 directly to the pins DQ1 through DQ3 in normal mode. Because of that setup, an access delay develops only at the pin DQ0 in normal mode of the conventional semiconductor integrated circuit.

SUMMARY OF THE INVENTION

It is therefore a first object of the present invention to overcome the above and other deficiencies of the prior art and to provide a semiconductor integrated circuit having numerous memory cell arrays which are tested in a short time so that the time in which to access the arrays is measured precisely, with no access delay detected on any of I/O pins of the circuit.

It is a second object of the present invention to provide a test method for testing precisely in a short time a semiconductor integrated circuit comprising a large number of memory cell arrays.

The above objects of the present invention are achieved by a semiconductor integrated circuit having a facility for concurrently checking a plurality of output signals. The semiconductor integrated circuit includes a coincidence detection circuit for checking whether a plurality of output signals coincide with one another. The semiconductor integrated circuit also includes a representative output buffer for outputting a specific output signal to a representative pin alone if the plurality of output signals are judged to coincide with one another. The representative output buffer blocks the specific output signal and places the representative pin into a high-impedance state together with all other pins if the plurality of output signals are not judged to coincide with one another.

The above objects of the present invention are achieved by a method for testing a semiconductor integrated circuit having a plurality of output buffers and a plurality of input/output pins corresponding to the plurality of output signals as well as an output buffer selection circuit for selecting in test mode one of the plurality of output buffers as the representative output buffer while deactivating the remaining output buffers.

In the method, the output buffer selection circuit selects successively each of the plurality of output buffers as the representative output buffer in order to test all input/output pins for electrical connection and to measure memory access times via the input/output pins.

Other objects and further features of the present invention will be apparent from the following detailed description when read in conjunction with the accompanying drawings.

BRIEF DESCRIPTION OF THE DRAWINGS

FIGS. 4A through 4F are timing charts illustrating a first operation of the semiconductor integrated circuit as the second embodiment works;

FIGS. 5A through 5F are timing charts depicting a second operation of the semiconductor integrated circuit as the second embodiment works;

DESCRIPTION OF THE PREFERRED EMBODIMENTS

Figure 1A:
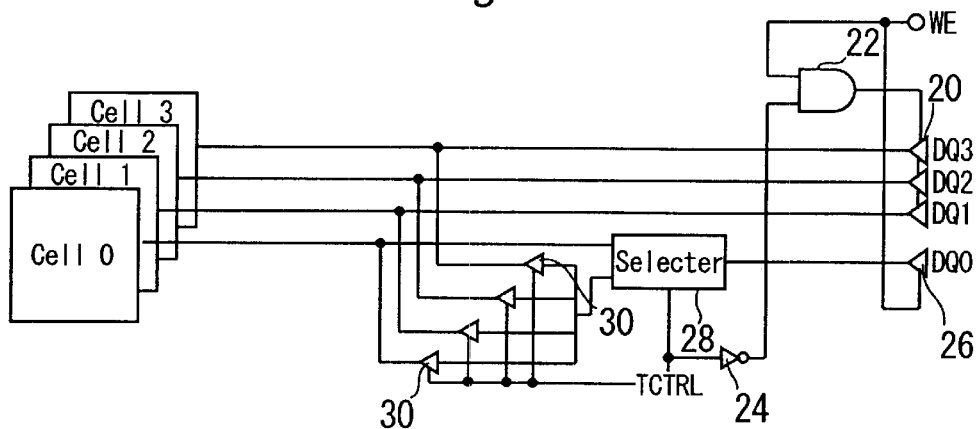
FIGS. 1A and 1B are block diagrams of a semiconductor integrated circuit practiced as a first embodiment of the invention.

Preferred embodiments of this invention will now be described with reference to the accompanying drawings. Throughout the drawings, like reference characters designate like or corresponding parts.

First Embodiment

Figure 1B:
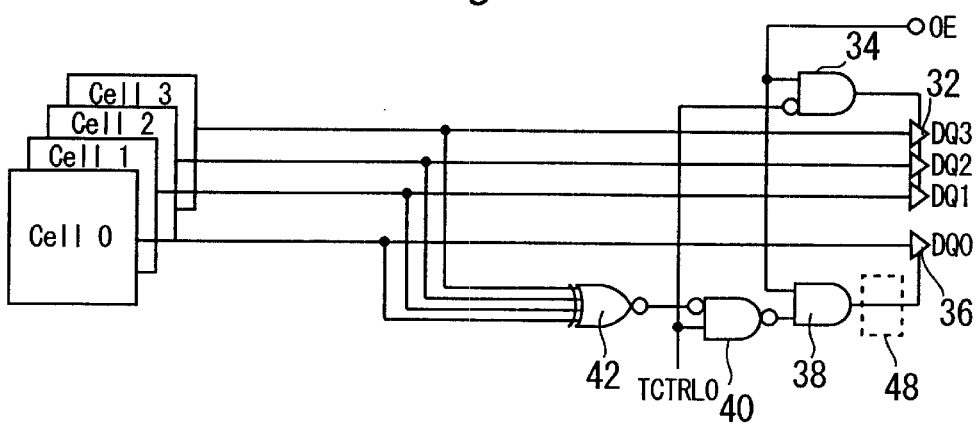

FIGS. 1A and 1B are block diagrams of a semiconductor integrated circuit practiced as the first embodiment of the invention. More specifically, FIG. 1A is a block diagram showing a procedure for inputting data through a representative pin DQ0 and writing the input data to a plurality of memory cell arrays CELL0 through CELL3 of the semiconductor integrated circuit as the first embodiment. FIG. 1B is a block diagram depicting a procedure for outputting via the representative pin DQ0 signals indicative of states of the multiple memory cell arrays CELL0 through CELL3 in the first embodiment.

As shown in FIG. 1A, the semiconductor integrated circuit of the first embodiment typically has I/O pins DQ0 through DQ3 corresponding to the memory cell arrays CELL0 through CELL3. The I/O pins DQ1, DQ2 and DQ3 are furnished with I/O buffers 20 respectively. The input buffers 20 are connected to an output terminal of an AND circuit 22. One input terminal of the AND circuit 22 is fed with a WE (Write Enable) signal and the other input terminal is supplied with a control signal TCTRL via an inverter 24. The signal TCTRL is held on the Low level in normal mode and raised to the High level in test mode.

The I/O buffers 20 are activated when the signal TCTRL is Low (i.e., in normal mode) and when the WE signal is input. That is, no signal input is allowed via the pins DQ1, DQ2 and DQ3 when the WE signal is not input and when test mode is in effect. The representative pin DQ0 is provided with an I/O buffer 26 designed to be activated when the WE signal is input. This means that signals are allowed to be input and output through the pin DQ0 both in normal mode and in test mode as long as the WE signal is input.

A selector 28 is interposed between the memory cell array CELL0 and the pin DQ0. The selector 28 has two paths: a normal path for ensuring direct conduction between the pin DQ0 and the memory cell array CELL0, and a test input path for connecting the pin DQ0 to the memory cell arrays CELL0 through CELL3 by way of a buffer circuit 30. If the signal TCTRL is Low (i.e., in normal mode), the selector 28 conducts the normal path alone; if the signal TCTRL is High (in test mode), the selector 28 blocks the normal path to make the test input path conductive. The signal TCTRL is also fed to the buffer circuit 30. The buffer circuit 30 remains inactive when the signal TCTRL is Low (in normal mode) and is activated when the signal TCTRL is brought High (in test mode). This means that in test mode, data input through the pin DQ0 are fed equally to all multiple memory cell arrays CELL0 through CELL3.

As depicted in FIG. 1B, the semiconductor integrated circuit of the first embodiment comprises output buffers 32 corresponding to the pins DQ1, DQ2 and DQ3. The output buffers 32 are connected to an output terminal of an AND circuit 34. A non-inverting input terminal of the AND circuit 34 is fed with an OE (Output Enable) signal and its inverting input terminal is supplied with the control signal TCTRL. Thus the output buffers 32 are activated when the signal TCTRL is brought Low (in normal mode) with the OE signal input. The output buffers 32 are always inactive when the signal TCTRL is driven High (in test mode). In this case, the pins DQ1, DQ2 and DQ3 are in the high-impedance (Hi-Z) state.

The representative pin DQ0 is furnished with an output buffer 36 that is fed with an output signal of an AND circuit 38. One input terminal of the AND circuit 38 is fed with the OE signal and the other input terminal is supplied with an output signal of a NAND circuit 40. The output buffer 36 is activated when the output signal of the NAND circuit 40 and the OE signal are both driven High.

A non-inverting input terminal of the NAND circuit 40 is supplied with the signal TCTRL. An inverting input terminal of the NAND circuit 40 is connected to an output terminal of a coincidence detection circuit 42. The coincidence detection circuit 42 is made up of an exclusive-OR circuit having four input terminals connected to the memory cell arrays CELL0 through CELL3. Only when data from the memory cell arrays CELL0 through CELL3 coincide with one another does the coincidence detection circuit 42 effect a High-level output. This means that in normal mode where the signal TCTRL is Low, the output signal of the NAND circuit 40 is always driven High, in test mode where the signal TCTRL is High, the High-level output results only if data from the memory cell arrays CELL0 through CELL3 coincide with one another.

Thus the output buffer 36 of the representative pin DQ0 remains active in normal mode when the OE signal is High, and is activated in test mode only if data from the memory cell arrays CELL0 through CELL3 coincide with one another and if the OE signal is driven High. If data from the memory cell arrays CELL0 through CELL3 do not coincide in test mode, the output buffer 36 is deactivated. In that case, the representative pin DQ0 is in the high-impedance (Hi-Z) state.

Figure 2:
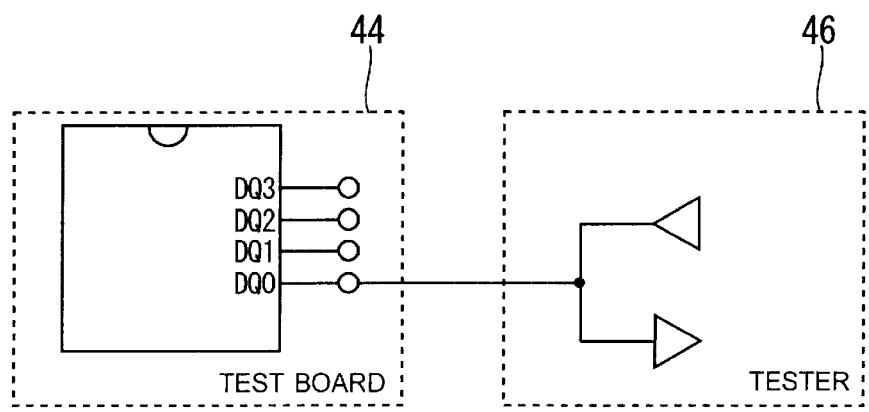
FIG. 2 is a block diagram showing a test board and a tester connected to test the semiconductor integrated circuit as the first embodiment.

FIG. 2 is a block diagram showing a test board 44 and a tester 46 connected to test the semiconductor integrated circuit as the first embodiment. In the setup of FIG. 2, the semiconductor integrated circuit is tested by simply connecting the representative pin DQ0 to an I/O pin of the tester 46. How the testing proceeds is described below in more detail.

After the connections shown in FIG. 2 have been formed to test the semiconductor integrated circuit, the control signal TCTRL is brought High. In that state, common data are written via the representative pin DQ0 to all memory cell arrays CELL0 through CELL3 by driving the WE signal High for the write operation (see FIG. 1A).

After the common data have been written to the memory cell arrays CELL0 through CELL3, the data are retrieved therefrom by driving the OE signal High for the read operation. The retrieved data from the memory cell arrays CELL0 through CELL3 are fed to the output buffers 32 and 36. Because the output buffers 32 are inactive in test mode, the data from any of the cell arrays CELL1 through CELL3 do not reach the I/O pins DQ1, DQ2 and DQ3 which are in the high-impedance state (Hi-Z) state at that time.

The output buffer 36 of the representative pin DQ0 remains active in test mode if the data from the memory cell arrays CELL0 through CELL3 coincide with one another. Thus if the data from the cell arrays CELL0 through CELL3 coincide, the data from the cell array CELL0 are output via the representative pin DQ0. If the data from the memory cell arrays CELL0 through CELL3 do not coincide with one another, then the coincidence detection circuit 42 effects a Low-level output, deactivating the output buffer 36. This means that in case of a mismatch of the data from the memory cell arrays CELL0 through CELL3, the effect of the mismatch reaches the output buffer 36 before the representative pin DQ0 is placed in the high-impedance (Hi-Z) state. It follows that the first embodiment makes it possible to verify coincidence of data read from the memory cell arrays CELL0 through CELL3 depending on whether the representative pin DQ0 is High, Low or in the high-impedance (Hi-Z) state following the read operation.

In the above tests, the matched data from the memory cell arrays CELL0 through CELL3 cause the data from the array CELL0 to reach the representative pin DQ0. That is, if the data from the memory cell arrays CELL0 through CELL3 coincide with one another in test mode, the representative pin DQ0 receives the same data as those in normal mode over the same path as that in normal mode. Thus the inventive test method makes it possible to examine precisely the time required to access the semiconductor integrated circuit in read operations.

In the semiconductor integrated circuit of the first embodiment, output signals from the memory cell array CELL0 are arranged to reach directly the representative pin DQ0 while bypassing the selector. That is, in the first embodiment, the output signals from the memory cell array CELL0 propagate over the same path as that traveled by output signals from the cell arrays CELL1, CELL2 or CELL3 to the pin DQ1, DQ2 or DQ3. This structure allows the first embodiment to prevent access delays from occurring at the representative pin DQ0.

In addition, after the data retrieved from the memory cell array CELL0 have reached the output buffer 36 in test mode, the semiconductor integrated circuit of the first embodiment causes a match or a mismatch of the data from the cell arrays CELL0 through CELL3 to be reflected in the output from the AND circuit 38 upon elapse of a predetermined delay time. More specifically, the semiconductor integrated circuit of the present embodiment is designed so as to determine active or inactive of the output buffer 36 after the data of the cell array CELL0 output via the pin DQ0 are amplified to a certain level which allows the tester 46 accurate judgments.

If the output buffer 36 is deactivated immediately after the output via the pin DQ0 of the data from the memory cell array CELL0, a spike noise may emanate from the pin DQ0. On the other hand, if the output buffer 36 is deactivated after the potential at the pin DQ0 is sufficiently amplified, the spike noise is fully suppressed. Thus in case of a mismatch of the data from the memory cell arrays CELL0 through CELL3, the semiconductor integrated circuit of the first embodiment is capable of adequately inhibiting the spike noise. With the first embodiment, the delay time required to implement the above feature is generated by use of merely the coincidence detection circuit 42, NAND circuit 40 and AND circuit 38. Alternatively, a delay circuit 48 may be interposed illustratively between the AND circuit 38 and the output buffer 36.

Second Embodiment

Figure 3:
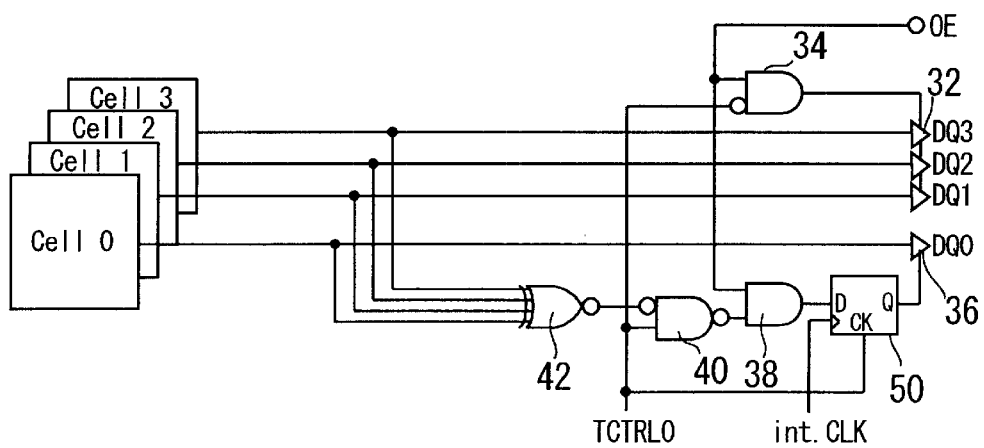
FIG. 3 is a block diagram of a semiconductor integrated circuit practiced as a second embodiment of the invention.

The second embodiment of this invention will now be described with reference to FIGS. 3 through 5. FIG. 3 is a block diagram of a semiconductor integrated circuit practiced as the second embodiment of the invention. In this semiconductor integrated circuit, a D flip-flop 50 is provided interposingly between an output buffer 36 and an AND circuit 38 associated with a representative pin DQ0. In synchronism with a leading edge of an internal clock signal, the D flip-flop 50 latches an output signal from the AND circuit 38. In case of a mismatch of signals from the memory cell arrays CELL0 through CELL3, the second embodiment puts the representative pin DQ0 in the high-impedance (Hi-Z) state in the cycle next to that in which the mismatched signals were output and in synchronization with the internal clock signal.

FIGS. 4A through 4F are timing charts illustrating a first operation of the semiconductor integrated circuit as the second embodiment works. When a /RAS signal is input while a /WE signal is being invalid (at High level), the semiconductor integrated circuit receives an X address to activate the corresponding word line. When a /CAS signal is then input while the /WE signal remains invalid, the semiconductor integrated circuit receives a Y address and starts reading data from the corresponding address location. FIGS. 4B through 4D show signal waveforms in effect when requests for read operations are issued in two consecutive cycles to the semiconductor integrated circuit.

FIG. 4E indicates a signal waveform that appears at the representative pin DQ0 when a first read operation has caused matched signals to be output from the memory cell arrays CELL0 through CELL3. In that case, with two read operations carried out, the representative pin DQ0 receives in two consecutive cycles the data corresponding to the designated address from the memory cell array CELL0.

FIG. 4F shows a signal waveform that appears at the representative pin DQ0 when a first read operation has caused mismatched signals to be output from the memory cell arrays CELL0 through CELL3. In this case, only the data corresponding to the first read operation appear at the representative pin DQ0. With a second read operation carried out, an intermediate potential indicative of the high-impedance state develops at the representative pin DQ0.

FIGS. 5A through 5F are timing chart depicting a second operation of the second embodiment works. FIGS. 5B through 5D depict an example in which the /RAS and /CAS signals are input successively to request reading of data from address (X0, Y0). Issued next is a command whereby the /RAS signal is input with the /WE signal enabled. The command deactivates the currently activated word line. Then the /RAS and /CAS signals are input successively to request reading of data from address (X1, Y1)

FIG. 5E illustrates a signal waveform that appears at the representative pin DQ0 when a first read operation has caused matched signals to be output from the memory cell arrays CELL0 through CELL3. In this case, with two read operations carried out, the representative pin DQ0 receives from the memory cell array CELL0 the data corresponding to addresses (X0, Y0) and (X1, Y1).

FIG. 5F shows a signal waveform that appears at the representative pin DQ0 when the first read operation has caused mismatched signals to be output from the memory cell arrays CELL0 through CELL3. In this case, the data corresponding to the first read operation appear at the representative pin DQ0. With the second read operation carried out, an intermediate potential indicative of the high-impedance state develops at the representative pin DQ0.

As described and according to the second embodiment of the invention, if mismatched data are retrieved in a given read cycle from the memory cell arrays CELL0 through CELL3, the representative pin DQ0 may be placed in the high-impedance state in the next read cycle. Thus the second embodiment allows the states of the memory cell arrays constituting the semiconductor integrated circuit to be accurately detected through monitoring of the potential at the representative pin DQ0 in synchronism with the clock signal.

In the second embodiment above, one D flip-flop is positioned upstream of the output buffer 36 so that a match or a mismatch of data read in a given cycle is reflected at the representative pin DQ0 in the next read cycle. However, this is not limitative of the invention. Alternatively, a plurality of D flip-flops may be provided so that a match or a mismatch of data retrieved in a given cycle may be reflected at the representative pin DQ0 in a read operation upon elapse of a plurality of cycles.

Third Embodiment

Figure 6:
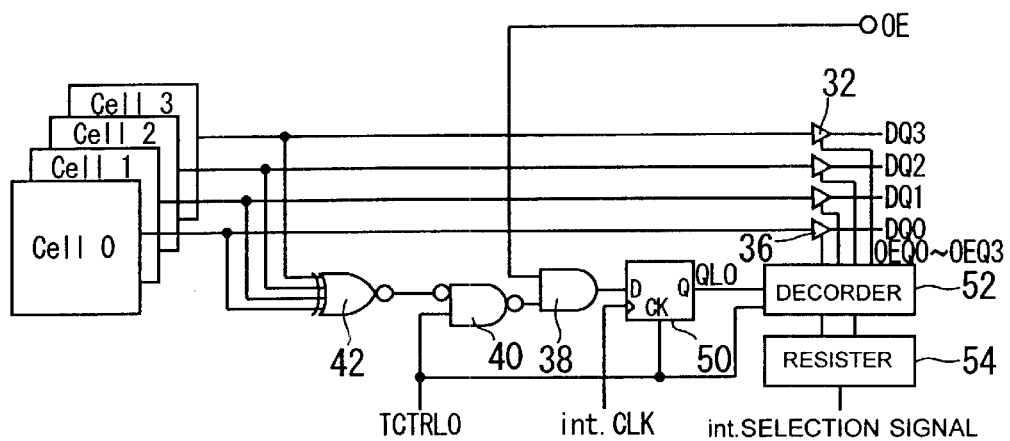
FIG. 6 is a block diagram of a semiconductor integrated circuit practiced as a third embodiment of the invention.
Figure 7:
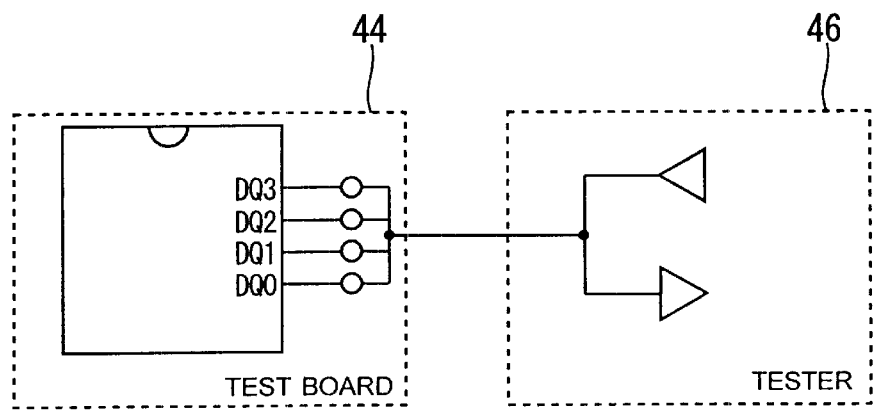
FIG. 7 is a block diagram showing a test board and a tester connected to test the semiconductor integrated circuit as the third embodiment.

The third embodiment of this invention will now be described with reference to FIGS. 6 and 7. FIG. 6 is a block diagram of a semiconductor integrated circuit practiced as the third embodiment of the invention. FIG. 7 is a block diagram showing a test board 44 and a tester 46 connected to test the semiconductor integrated circuit of the third embodiment. As illustrated in FIG. 7, the testing of this embodiment is accomplished with all I/O pins DQ0 through DQ3 of the semiconductor integrated circuit connected to a single I/O pin of the tester 46.

As shown in FIG. 6, the semiconductor integrated circuit of the third embodiment comprises a decoder 52 and a register 54. The register 54 holds an internal selection signal, i.e., a signal that identifies the I/O pin used as the representative pin in test mode. The internal selection signal is sent to the semiconductor integrated circuit in a properly timed fashion through an address pin or an I/O pin.

In the third embodiment, all output buffers 32 and 36 receive an output signal of a D flip-flop 50 via the decoder 52. When a control signal TCTRL0 remains High (i.e., in test mode), the decoder 52 allows the output signal of the D flip-flop 50 to be fed only to one output buffer designated by the internal selection signal while deactivating the remaining output buffers. When the control signal TCTRL0 is driven Low (i.e., in normal mode), the decoder 52 activates all output buffers 32 and 36.

The semiconductor integrated circuit of the third embodiment allows all memory cell arrays CELL0 through CELL3 to be directly connected to the tester 46 by suitably switching the internal selection signal. Thus the third embodiment makes it possible to verify directly the conductance of the wiring through all memory cell arrays CELL0 through CELL3, as well as to measure directly the time in which to access all memory cell arrays CELL0 through CELL3.

As depicted in FIG. 7, the semiconductor integrated circuit of the third embodiment is tested with all I/O pins DQ0 through DQ3 connected to the tester 46. In this case, the tester 46 can supply the same data to all I/O pins DQ0 through DQ3. This makes it possible for the third embodiment to write common data to the memory cell arrays CELL0 through CELL3 without using a write-dedicated circuit arrangement such as the one in FIG. 1A, i.e., a circuit for writing the same data to all cell arrays CELL0 through CELL3 via the representative pin.

Fourth Embodiment

Figure 8:
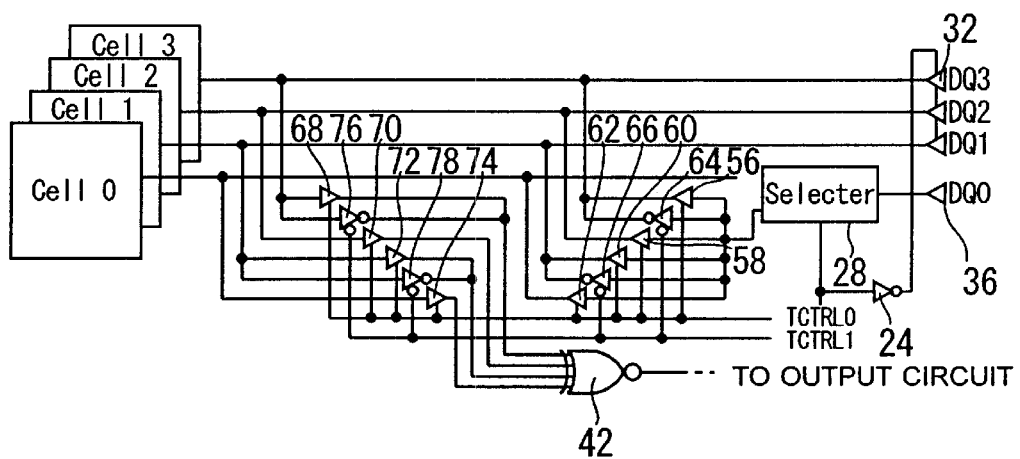
FIG. 8 is a block diagram of a semiconductor integrated circuit practiced as a fourth embodiment of the invention.
Figure 9A:
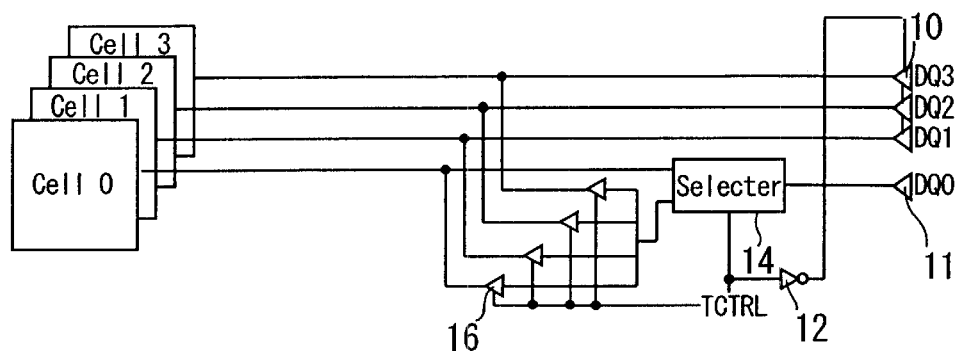
FIGS. 9A and 9B are block diagrams of a conventional semiconductor integrated circuit.
Figure 9B:
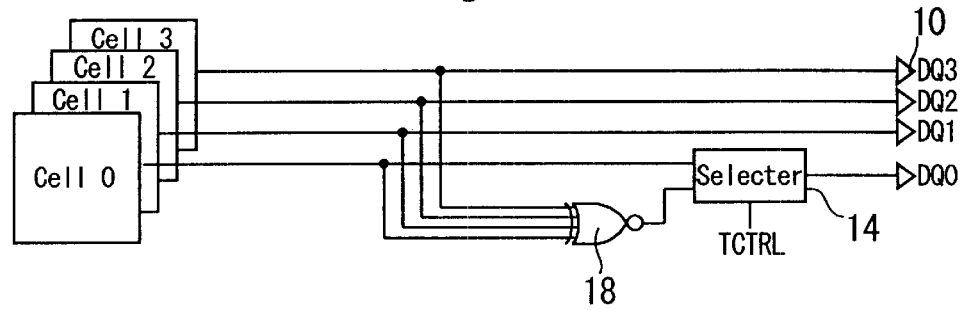

The fourth embodiment of this invention will now be described with reference to FIG. 8. FIG. 8 is a block diagram of a semiconductor integrated circuit practiced as the fourth embodiment of the invention. The setup of FIG. 8 omits for space reasons an output circuit for processing output signals from a coincidence detection circuit 42. That output circuit may be implemented in the form of a similar circuit used by any one of the first through the third embodiment of this invention.

In the fourth embodiment, buffer circuits 56 through 62 are located interposingly between a selector 28 on the one hand and memory cell arrays CELL0 through CELL3 on the other hand. An inverter 64 is interposed between the selector 28 and the cell array CELL3 in parallel with the buffer circuit 56, and an inverter 66 is interposed between the selector 28 and the cell array CELL1 in parallel with the buffer circuit 60.

The buffer circuit 56 is arranged to be activated when control signals TCTRL0 and TCTRL1 are both driven High, and is deactivated when the signal TCTRL1 is brought Low. The inverter circuit 64 is arranged to be activated when the control signal TCTRL1 is brought Low. That is, the buffer circuit 56 is set to be enabled when the signal TCTRL1 is driven High, and the inverter circuit 64 is set to be enabled when the signal TCTRL1 is brought Low.

Likewise, the buffer circuit 60 is set to be enabled when the two control signals TCTRL0 and TCTRL1 are both driven High, and the inverter 66 is set to be enabled when the signal TCTRL1 is brought Low. Meanwhile, the buffer circuits 58 and 62 connected to the memory cell arrays CELL2 and CELL0 respectively are arranged to remain active as long as the control signal TCTRL0 is High.

In the structure above, common data are written to the memory cell arrays CELL0 through CELL3 via the selector 28 by driving both control signals TCTRL0 and TCTRL1 High. If the signal TCTRL0 are driven High and the signal TCTRL1 brought Low, a body of data is written to the memory cell arrays CELL0 and CELL2 while a body of inverted data is written to the cell arrays CELL1 and CELL3 by way of the selector 28.

The semiconductor integrated circuit of the fourth embodiment has buffer circuits 68 through 74 interposed between the memory cell arrays CELL0 through CELL3 on the one hand and a coincidence detection circuit 42 on the other hand. An inverter 76 is located interposingly between the cell array CELL3 and the coincidence detection circuit 42 in parallel with the buffer circuit 68, and an inverter 78 is interposed between the cell array CELL1 and the coincidence detection circuit 42 in parallel with the buffer circuit 72.

The buffer circuit 68 is arranged to be activated when the control signals TCTRL0 and TCTRL1 are both driven High and deactivated when the signal TCTRL1 is brought Low. The inverter circuit 76 is arranged to be activated when the signal TCTRL1 is brought Low. That is, the buffer circuit 68 is set to be enabled when the control signal TCTRL1 is driven High, and the inverter 76 is set to be enabled when the signal TCTRL1 is brought Low.

Likewise, the buffer circuit 72 is set to be enabled when the control signals TCTRL0 and TCTRL1 are both driven High, and the inverter 78 is set to be enabled when the signal TCTRL1 is brought Low. Meanwhile, the buffer circuits 70 and 74 connected to the memory cell arrays CELL2 and CELL0 respectively are arranged to remain active as long as the control signal TCTRL0 is High.

In the above structure, the data retrieved from the memory cell arrays CELL0 through CELL3 are sent unmodified to the coincidence detection circuit 42 when booth control signals TCTRL0 and TCTRL1 are driven High. If the signal TCTRL0 is driven High and the signal TCTRL1 is brought Low, the data read from the cell arrays CELL0 and CELL2 are transferred unmodified to the coincidence detection circuit 42 while the data retrieved from the cell arrays CELL1 and CELL3 are fed inverted to the coincidence detection circuit 42.

The semiconductor integrated circuit of the fourth embodiment is illustratively placed in test mode by having the control signal TCTRL0 driven High. With the signal TCTRL1 brought High for data write and read operations to and from the memory cell arrays, common data are written to all memory cell arrays CELL0 through CELL3 to check subsequently whether the data are retrieved correctly, in the same manner as with the first through the third embodiment. When the signal TCTRL1 is driven Low for data write and read operations to and from the memory cell arrays, two signals inverted with respect to each other are written to contiguously located memory cell arrays. The signals are subsequently read from the cell arrays to determine whether the data have been correctly retrieved.

Where signals inverted with regard to each other are written to memory cell arrays located adjacent to each other, the signals may develop interference there between during propagation. To allow for adverse effects of such interference in measuring access time requires performing a test while writing a set of data to a given memory cell array and a set of inverted data to another memory cell array adjacent thereto. The semiconductor integrated circuit of the fourth embodiment permits such tests in a simplified manner.

The major benefits of the present invention described above are summarized as follows:

A semiconductor integrated circuit according-to one aspect of the invention is capable of judging whether a plurality of output signals coincide with one another on the basis of whether a specific output signal appears at a representative pin. With this structure in test mode, the representative pin receives an unmodified output signal as in the case of normal mode. This allows the access time at the representative pin to be measured accurately. Because no selector is disposed on the path over which the specific output signal is sent to the representative pin, any access delay is prevented from occurring only at the representative pin in normal mode.

A semiconductor integrated circuit in one preferred structure of the invention allows the state of the representative output buffer to be determined upon elapse of a predetermined delay time after the specific output signal has reached the representative pin. This makes it possible to prevent spike noise from developing at the representative pin when a plurality of output signals do not coincide with one another.

A semiconductor integrated circuit in another preferred structure of the invention causes the representative output buffer to be fed with a signal indicative of whether a plurality of output signals coincide with one another. The coincidence indication signal is sent to the representative output buffer upon elapse of a predetermined number of clock cycles following output of the multiple output signals. This structure makes it possible to check accurately whether the multiple output signals coincide with one another upon judgment of the state of the representative pin in synchronism with a clock signal.

A semiconductor integrated circuit in a further preferred structure of the invention includes an output buffer selection circuit for changing the representative output buffer and representative pin as desired. This structure allows all output pins to be checked for electrical connection and tested for access time.

A semiconductor integrated circuit in an even further preferred structure of the invention has at least part of its signal output paths made of a non-inverting path and an inverting path. Where all output signals are expected to coincide with one another, the signals are transferred over the non-inverting path so that a coincidence detection circuit may determine whether all output signals are correct. Where part of the output signals are expected to be inverted, only the signals so expected are transferred over the inverting path so that the coincidence detection circuit may determine whether all output signals are correct. This structure makes it possible to determine whether the output signals are correctly output regardless of whether the output signals are expected to coincide totally with one another or to be partially inverted.

A semiconductor integrated circuit in a still further preferred structure of the invention has two types of signal output paths arranged alternately, one type of path having the non-inverting path only, the other type of path having both the non-inverting path and the inverting path. With this structure, if two signals propagating over two contiguous signal output paths are inverted with respect to each other, the coincidence detection circuit determines accurately whether these signals are correct. This makes it possible precisely to measure access times that could be affected by interference between two contiguously propagating signals inverted with regard to each other.

According to a testing method of the second aspect of the present invention, a preferred semiconductor integrated circuit is checked for electrical connection and measured access times with regard to all I/O pins thereof.

Further, the present invention is not limited to these embodiments, but variations and modifications may be made without departing from the scope of the present invention.

The entire disclosure of Japanese patent application no. 2000-109917 filed on Apr. 11, 2000 including specification, claims, drawings and summary are incorporated herein by reference in its entirety.

What is claimed is:

1. A semiconductor integrated circuit having a facility for concurrently checking a plurality of output signals, said semiconductor integrated circuit comprising:

a coincidence detection circuit for checking whether a plurality of output signals coincide with one another; and a representative output buffer for outputting a specific output signal to a representative pin alone if said plurality of output signals are judged to coincide with one another, said representative output buffer further blocking said specific output signal and placing said representative pin into a high-impedance state together with all other pins if said plurality of output signals are not judged to coincide with one another.

2. The semiconductor integrated circuit according to claim 1, further comprising a delay circuit for allowing a predetermined delay time to elapse after said specific output signal has reached said representative output buffer and until a state of said representative output buffer is determined.

3. The semiconductor integrated circuit according to claim 1, wherein said plurality of output signals are output in synchronism with a clock signal, said semiconductor integrated circuit further comprising a latch circuit for transferring to said representative output buffer a signal indicative of whether said plurality of output signals coincide with one another, said signal being transferred in synchronism with said clock signal upon elapse of a predetermined number of clock cycles following output of said plurality of output signals.

4. The semiconductor integrated circuit according to claim 1, further comprising:

a plurality of output buffers and a plurality of input/output pins corresponding to said plurality of output signals; and an output buffer selection circuit for selecting in test mode one of said plurality of output buffers as said representative output buffer while deactivating the remaining output buffers.

5. The semiconductor integrated circuit according to claim 1, further comprising:

a plurality of memory cell arrays which output said plurality of output signals concurrently; and a plurality of signal output paths for leading said plurality of output signals to said coincidence detection circuit;

wherein at least part of said plurality of signal output paths include a non-inverting path and an inverting path, said non-inverting path allowing the output signals from said memory cell arrays to be transferred unmodified to said coincidence detection circuit, said inverting path causing the output signal from said memory cell arrays to be transferred inverted to said coincidence detection circuit.

6. The semiconductor integrated circuit according to claim 5, wherein said plurality of signal output paths are constituted by two types of paths being alternately arranged between said memory cell arrays and input/output buffers, one of said two types of paths having said non-inverting path only, the other type of path having both said non-inverting path and said inverting path.

* * * * *